US 6,926,816 B2

(12) United States Patent
Sano et al.

(10) Patent No.: US 6,926,816 B2
(45) Date of Patent: Aug. 9, 2005

(54) ANALYSIS METHOD OF FILM THICKNESS DISTRIBUTION AND DESIGN SYSTEM OF PRINTED CIRCUIT BOARD AND MANUFACTURING PROCESSES (75) Inventors: Akihiro Sano, Hitachi (JP); Kinya Kobayashi, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 319 days.

(21) Appl. No.: 10/387,586

(22) Filed: Mar. 14, 2003

(65) Prior Publication Data
US 2003/0196181 A1 Oct. 16, 2003

(30) Foreign Application Priority Data
Apr. 11, 2002 (JP) ........................................ 2002-108956

(51) Int. Cl.[7] .......................... C25D 5/00; G06F 17/50
(52) U.S. Cl. ...................... 205/81; 204/229.8; 205/84; 700/121; 716/4
(58) Field of Search ............................. 205/81, 83, 84; 204/229.8; 700/117, 121, 266; 716/4

(56) References Cited
U.S. PATENT DOCUMENTS

| 4,548,285 A | * | 10/1985 | Sells et al. ..................... 177/1 |
| 5,084,153 A | * | 1/1992 | Mosse et al. ............ 204/230.3 |
| 6,542,784 B1 | * | 4/2003 | Amaya et al. ............... 700/121 |
| 6,565,729 B2 | * | 5/2003 | Chen et al. ..................... 205/82 |

OTHER PUBLICATIONS

U.S. Appl. No. 10/067,214, filed Feb. 7, 2002; entitled: "Semiconductor device and method of manufacturing the same".
U.S. Appl. No. 09/545,093, filed Apr. 7, 2000, entitled "Plating method, plating solution, semiconductor device and process for producing the same".

* cited by examiner

*Primary Examiner*—Roy King
*Assistant Examiner*—William T. Leader
(74) *Attorney, Agent, or Firm*—Crowell & Moring LLP (57) ABSTRACT

The object of the present invention is to provide a film thickness distribution analysis method that ensures quick and effective prediction of film thickness distribution by computer simulation in the pattern plating process.

On the circuit pattern of a printed circuit board, in the method for analyzing the thickness distribution of metal film plated selectively, hypothetically dividing the printed circuit board into one or more regions, introducing pattern density $\theta j = Aj/Sj$ (Sj: the area Sj of a desired region j, and Aj: the area of the plated surface inside the area j), and calculating the approximate average current density or film thickness distribution based on "approximation averaged by pattern density".

8 Claims, 7 Drawing Sheets

FIG. 1

TABLE 1

| | STRICT CALCULATION | APPROXIMATION AVERAGED BY PATTERN DENSITY |
|---|---|---|
| CURRENT DENSITY DISTRIBUTION | CURRENT DENSITY = i × PATTERN DENSITY PER WAFER AREA<br><br>PLATED SURFACE | CURRENT DENSITY = i × PATTERN DENSITY<br><br>PLATED AREA / SURFACE AVERAGED ON THE REGION AREA |
| BOUNDARY CONDITIONS | PLATED SURFACE : $-K\partial\psi/\partial n = C_0 \exp[\psi/c_1]$<br>RESIST : $-K\partial\psi/\partial n = 0$ | $-K\partial\psi/\partial n = \theta \cdot C_0 \exp[\psi/c_1]$ |

FIG. 2

```
DESIGN A CIRCUIT PATTERN
        ↓
DIVIDE THE WAFER SURFACE IN A DESIRED NUMBER OF
REGIONS AND SET THE PATTERN DENSITY OF EACH
REGION
        ↓
SET SUCH PLATING CONDITIONS AS ELECTROLYTE
CONDUCTIVITY, TAFEL CURVE AND AVERAGE CURRENT
DENSITY, AND CREATE AN ANALYSIS SYSTEM
        ↓
CALCULATE THE CURRENT DENSITY OR FILM THICKNESS
DISTRIBUTION ON THE PLATED SURFACE BASED ON THE
ANALYSIS METHOD WITH CONSIDERATION GIVEN TO THE
PATTERN DENSITY OF EACH AREA
```

TABLE 3

| AVERAGE CURRENT DENSITY $I_0$ [A/m²] | | 200 |
|---|---|---|
| ELECTROLYTE CONDUCTIVITY K [S/m] | | 50 |
| INCLINATION OF OVERVOLTAGE | $c_1$ [V] | 0.071 |
| | $a_1$ [V] | 0.027 |

TABLE 5

FIG. 7

FIG. 8

ANALYSIS METHOD OF FILM THICKNESS DISTRIBUTION AND DESIGN SYSTEM OF PRINTED CIRCUIT BOARD AND MANUFACTURING PROCESSES

BACKGROUND OF THE INVENTION

1. Field of the Invention

The present invention relates to an analysis method of film thickness distribution and a design system of printed circuit boards and manufacturing processes in the process of using pattern plating method for forming a plated film on a circuit pattern on a selective basis where a printed circuit board is formed by electroplating.

2. Prior Art

With recent increase in LSI speed and density, there has been a growing demand for lines of smaller size and greater number of multilayers in the printed circuit board for implementation of a semiconductor and mobile equipment.

In the prior art, subtractive process has been widely employed to form lines on the printed circuit board. In the subtractive process, metal is formed (by panel plating) on the entire surface of the substrate by electroplating, and unwanted part of the line is removed by etching, whereby lines are formed on the printed circuit board. However, the subtractive process requires the etching of a metal having a thickness on the order of 10 $\mu$m. This necessarily requires the side wall of the metal interconnecting line be etched, and formation of a fine interconnecting line and space is accompanied by difficulties. The maximum permissible size has been about 50 $\mu$m in interconnecting line and space width.

Under these circumstances described above, additive process has come to be used in recent years in order to provide a finer line on the printed circuit board. In the additive process, a circuit pattern is formed on a printed circuit board by a resist, and metal is then formed (by pattern plating) only on the circuit pattern by electroplating on a selective basis. According to this process, the metal line aspect ratio is almost the same as the resolution of resist, so this process is suited for formation of a fine line.

The additive process is available in three types of processes—full-additive, semi-additive and partly additive—depending on the difference in the processes before and after electroplating. In any of these process types, metal is formed only on the circuit pattern in the electroplating process on a selective basis.

In the pattern plating process, film is formed only on the circuit pattern, so a big imbalance occurs to the distribution of film thickness, depending on the density of the interconnecting line and arrangement of the chip (located at the center of the plated surface or at the end). A big imbalance in the distribution of film thickness will result in reduced yields and reliability. Further, it becomes difficult to increase the number of layers.

Optimization of the circuit pattern and improvement of the plating unit are required to ensure uniformity in the distribution of film thickness. Much development cost and time period are required in the case of experiment alone. Such being the case, there has been a long felt need for prediction of film thickness distribution by computer simulation.

The prior art includes the following electroplating film thickness analysis program by computer simulation:

"Electro-Plating Pilot System" by Uemura Industry {HYPERLINK"http://www.uemura.co.jp/uemura/epps/index.html", http://www.uemura.co.jp/uemura/epps/index.html}

Case Western Revers Univ. Cell Design http://www.L-Chem.com

According to the simulation process by electric field analysis using these prior art finite element method and boundary element method, massive amounts of meshes (ex. $10^{10}$ meshes) have been required to simulate an actual product with an extra-small width line (within several $\mu$m) present on a substrate of scores of square centimeters. Calculation has been very difficult.

SUMMARY OF THE INVENTION

The problem to be solved by the present invention is to provide an analysis method of film thickness distribution and a design system of printed circuit boards and manufacturing processes that ensure a short-time and efficient prediction of film thickness distribution by computer simulation in the pattern plating process that has been difficult to achieve in prior art.

In an aspect of the invention, to solve the above-mentioned problem, an analysis method of film thickness distribution for analyzing the distribution of film thickness of the deposited metal formed by electroplating method for selectively depositing metal on a printed circuit board comprises step of hypothetically dividing one or more printed circuit boards into one or more desired regions to get the area Sj of a desired region j and an area Aj of the plated surface inside said area j, step of introducing the pattern density θj=Aj/Sj defined by the ratio Aj/Sj into the function used in the analysis method of film thickness distribution, and step of calculating the approximate average current density or film thickness distribution based on the function.

In this case, in setting the boundary conditions in the aforementioned region the pattern density θj=Aj/Sj defined by the ratio Aj/Sj is introduced in the equation representing the boundary conditions of the aforementioned region j, or different boundary conditions corresponding to pattern density θj for each region j are used.

Here the current density $I_{m(j)}$ in the mesh $m_{(j)}$ inside the region j on a divided printed circuit board is used to ensure that the average current density of the entire analysis system=$[\Sigma_{j}=1, {}_{N}\Sigma_{m}=1, {}_{M(j)}\theta_{j} \times I_{m(j)} \times S_{m(j)}]/[\Sigma_{j}=1, {}_{N}\Sigma_{m}=1, {}_{M(j)} \theta_{j} \times S_{m(j)}]$ (where N represents the number of divided areas, and M(j) represents the number of meshes included in the area j) is set with a predetermined value Io.

Here, the area Sj of one or more specific region are made small compared with the area of the other region.

In another aspect of the invention, a design system of printed circuit boards and manufacturing processes comprises a designation unit for designating a desired film thickness distribution to said printed circuit board and designating the plating process, an analysis system creating unit for setting the pattern density θj=Aj/Sj defined by the ratio Aj/Sj (where Sj represents the area of a desired region j, and Aj represents an area of the plated surface inside said area j,) by dividing said printed circuit board into desired regions, a film thickness distribution analyzing unit for calculating film thickness distribution using said pattern density, an output unit for outputting said film thickness distribution, and a film thickness distribution evaluation unit for comparing said film thickness distribution and said desired film thickness distribution.

This design system provides design support services that present to a customer as output results, the film thickness distribution corresponding to the circuit pattern and plating process conditions designated by the customer.

DETAILED DESCRIPTION OF THE INVENTION

The following describes the first embodiment of the present invention, the electroplating analysis method where the current density on the printed circuit board is obtained by electric field analysis, and film thickness distribution is analyzed from the electrochemical equivalent, specific gravity and current efficiency (percentage of the current flowing to the printed circuit board that contributes to film formation) of deposited metal. In the first embodiment, the effect of flow due to ion diffusion in electrolyte and agitation of electrolyte are ignored.

In the method of analyzing the film thickness distribution by electric field analysis (approximate method), it has been known that there is precise agreement with the experimental value when there is quick agitation of the electrolyte, flow of electrolyte on the printed circuit board is a laminar flow parallel and uniform on the printed circuit board, and ion concentration is sufficiently large.

In prior art electric field analysis, the current density distribution on the wafer surface has been calculated by solving the Laplace equation (1) related to electrical potential $\psi$ under the boundary conditions (2) to (4).

$$\Delta\psi=0 \tag{1}$$

$$\psi=Va-\{a_o+a_1\cdot\log(K\partial\psi/\partial n)\} \tag{2}$$

$$\psi=c_o+c_1\cdot\log(-K\partial\psi/\partial n) \tag{3}$$

$$\partial\psi/\partial n=0 \tag{4}$$

Here equation (2) represents an anode boundary, (3) a plated surface boundary, and (4) boundary conditions on a resist and insulating material on the side wall of the system. Further, "n" in equations (2) through (4) denotes the normal direction of the boundary, and $\partial\psi/\partial n$ shows the potential gradient in the normal direction. "K" denotes the conductivity of electrolyte and $-K\partial\psi/\partial n$ shows the current density. "Va" in Equation (2) indicates voltage applied between an anode and wafer. Here the wafer refers to a plate on which one or more printed circuit boards are arranged. The second term in equation (2) and equation (3) is the overvoltage for promoting the reduction reaction on the anode and plating reaction on the plated surface formed by the hole or line (circuit pattern).

This embodiment is a Tafel equation where the relationship between current density $-K\partial\psi/\partial n$ and potential $\psi$ is connected in a logarithmic scale. Equations (2) and (3) can be rewritten into the following equivalent expressions:

$$-K\partial\psi/\partial n=A_o\cdot\exp[\psi/a_1] \tag{2b}$$

$$-K\partial\psi/\partial n=C_o\cdot\exp[\psi/c_1] \tag{3b}$$

where $A_o=\exp[(Va-a_o)/a_1]$, $Co=\exp[-co/c_1]$. They are both constants.

In the pattern plating process, plating is provided only on a circuit pattern formed by photo resist. Holes having a diameter on the order of 100 $\mu$m and fine line and spaces (resist surface) having a width of several scores of $\mu$m are densely distributed in the area (one side=several millimeters to scores of millimeters) of one chip (chip=printed circuit board). Further, about 100 the chips are located on the wafer.

Thus, according to the aforementioned prior art analysis method, massive amounts of calculation are required for the number of meshes required to reproduce several $\mu$m through several hundreds of the plated surfaces (boundary condition (3)) and resist surfaces (boundary condition (4)) present on a printed circuit board having a diameter of several centimeters. Even in the boundary element method that permits the number of meshes to be saved, $10^{10}$ meshes are required only inside the wafer surface, assuming that a triangular mesh having a side of 1 $\mu$m is created. So calculation is practically impossible.

In this embodiment, instead of considering the actual circuit pattern, a wafer is divided into specific regions, and the circuit pattern density $\theta j$ (plated area Aj in region J/Sj of region j) is introduced to calculate the approximate average current density. In the approximation in this embodiment, the boundary condition (3) or (3b) in region j is changed as follows:

$$\psi=c_o+c_1\cdot\log[(-K\partial\psi/\partial n)/\theta j] \tag{5}$$

$$-K\partial\psi/\partial n=\theta j\cdot Co\cdot\exp[\psi/c_1] \tag{5b}$$

Figure 1:
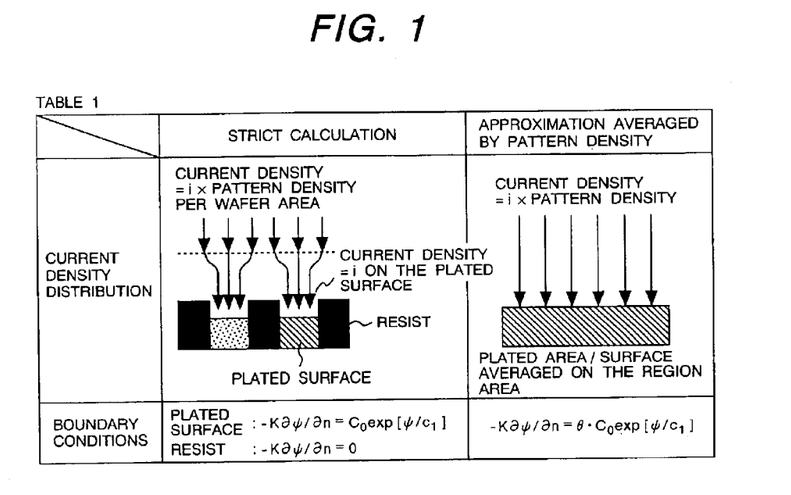
FIG. 1 is an explanatory diagram illustrating the film thickness distribution analysis method (approximation averaged by pattern density) as a first embodiment of the present invention (Table 1)

Mulchiplication of the right-hand side by $\theta j$ corresponds to approximation shown in FIG. 1 (Table 1). In other words, the current density i on the plate surface is calculated in the strict calculation (according to prior art calculation method). When converted into the value per unit wafer area, current density is represented by i×pattern density. In the approximation of this embodiment, this property is used to calculate the current density per wafer area—not the current density on the plated surface—through the use of the equation (5) or (5b). According to the approximation method of the present embodiment, the current density $i_j$ of region j obtained by electric field analysis under the aforementioned boundary conditions is divided by $\theta_j$.

$$i_j=-K\partial\psi/\partial n\rightarrow(-K\partial\psi/\partial n)/\theta_j \tag{6}$$

As shown in this equation, the current density per wafer area is reconverted into the actual current density per metal line area, thereby getting the current density distribution in the pattern plating process. This analysis method is called the "approximation averaged by pattern density".

In the approximation averaged by pattern density, a substantial reduction in the number of meshes can be achieved by dividing the printed circuit board into appropriate regions.

In the approximation method according to the present embodiment, the regions for defining the pattern density can be divided; (1) for each region where uniform distribution of lines can be recognized, (2) for each mesh, (3) for each chip, and (4) constant for the entire wafer surface. In a region where there is a marked distribution of line density, meshes corresponding to the actual pattern are regarded as such only in that region, and are accurately handled so that averaging can be achieved in other regions (zoom-in method).

The following describes the second embodiment of the present invention to explain that the approximation averaged by pattern density is also applicable to the analysis method where ion diffusion is taken into account.

A variety of ions are present in the electrolyte. The word "ion" appearing in the following description refers to the component for film formation in plating process. For example, it refers to $Cu^{2+}$ ion in the electrolyte in the electroplating for copper film formation.

The following describes the effect of ion diffusion. According to the equation (3) or (3b) where only the electric field effect is taken into account, the absolute value of current density $|-K\partial\psi/\partial n|$ exhibits a more monotonous increase as the potential $\psi$ becomes greater. However, film forming speed is increased with current density. If there is an increase in film forming speed, ions in the vicinity of the plated surface are consumed by film formation on the plated surface, with the result that ion concentration on the electrolyte side. If there is a decrease in ion supply speed from the farther to the closer position of the plated surface (called the diffusion speed since ion is normally supplied by diffusion) as compared with film forming speed, ion concentration in the vicinity of the plated surface will be much reduced, with the result that the current density reaches the maximum value (diffusion limit current density).

Let us use the model of Nerhst's diffusion layer to consider the effect of ion diffusion is taken into account. From equation (3) or (3b), the boundary conditions on the plated surface are changed as follows:

$$\psi=c_o+c_1\cdot\log[(-K\partial\psi/\partial n)/\{Co\cdot(C_{bulk}-(-K\partial\psi/\partial n\cdot\delta)/zFD)\}] \quad (7)$$

or $$-K\partial\psi/\partial n=Co\cdot C_{bulk}\cdot\exp(\psi/c_1)/[1+Co\cdot\delta\cdot\exp(\psi/c_1)/zFD] \quad (7b)$$

Where $\delta$ denote the thickness of Nernst's diffusion layer, z charge of an ion, F a Faraday constant, D diffusivity of ion in electrolyte, and $C_{bulk}$ an ion concentration of bulk (a position removed from plated surface to electrolyte side by "$\delta$" or more). Other variables are the same as those used in the first embodiment.

In the equation (7) or (7b), the maximum value ($\psi\rightarrow$infinite) is present to the current density. It is given by diffusion limited current=$zFD\ C_{bulk}/\delta$. In the region of current density sufficiently smaller than diffusion limited current, the equation is functional as in the case of equation (3) or (3b). Even when the effect of ion diffusion is taken into account, the concept of FIG. 1 (Table 1) of current density is valid and applicable; therefore, current density can be made uniform in the water area if current density is made so that it can be expressed by the following equation using the pattern density $\theta j$ of region j, as in the case of the first embodiment:

$$\psi=c_o+c_1\log[(-K\partial\psi/\partial n/\theta j)/\{Co\cdot(C_{bulk}-(-K\partial\psi/\partial n/\theta j\cdot\delta)/zFD)\}] \quad (8)$$

or $$-K\partial\psi/\partial n=\theta j\cdot Co\cdot C_{bulk}\cdot\exp(\psi/c_1)/[1+Co\cdot\delta\cdot\exp(\psi/c_1)/Zfd] \quad (8b)$$

In the present embodiment, the current density obtained by electric field analysis under the boundary conditions (8) or (8b) is subjected to the conversion of equation (6).

As described above, the approximation averaged by pattern density is applicable even when ion diffusion is taken into account.

The second embodiment is valid if diffusion layer thickness $\delta$ is constant when electrolyte flow layer is a laminar flow uniform and parallel to the wafer surface. If the electrolyte flow layer is not a laminar flow uniform or parallel to the wafer surface, one need only solve the fluid equation of electrolyte, thereby calculating the $\delta$ that depends on the position. If $\delta$ is not constant, there will be a local dependence of the speed of supplying ions to the plated surface (diffusion speed), and this will cause uneven ion concentration. In this case, it is also possible to make extension in such a way that the ion concentration on the plated surface is calculated according to the solution method based on concentration diffusion equation, and current density is calculated in combination with electric field analysis.

In considering a more complicated embodiment, assume that the following relationship between current density and potential on the plated surface is given by:

either $$\psi=F(-K\partial\psi/\partial n) \quad (9)$$

or $$-K\partial\psi/\partial n=F^*(\psi) \quad (9b).$$

Then the boundary conditions inside the region j on the wafer surface are changed into either $$\psi=F(-K\partial\psi/\partial n/\theta j) \quad (10)$$

or $$-K\partial\psi/\partial n=\theta j\cdot F^*(\psi) \quad (10b)$$

This allows application of approximation averaged by pattern density.

When one wishes to perform calculation using the approximation averaged by pattern density on the assumption that the average current density (entire current I on plated surface/plated area S) is constant, the prior art I and S calculation method must be modified, as shown below.

The prior art is expressed by $$I=\Sigma_{m=1},\ _Mi_m\cdot S_m \quad (11)$$

$$S=\Sigma_{m=1},\ _MS_m \quad (12)$$

where m denotes the mesh number on the plated surface, $i_m$ a current density of mesh m, and $S_m$ an area.

By contrast, in the approximation averaged by pattern density, the average current density I/S is calculated according to the following equation:

$$I=\Sigma_{j=1},\ _N\Sigma_{m=1},\ _{M(j)}\theta_j\times I_{m(j)}\times S_{m(j)} \quad (13)$$

$$S=\Sigma_{j=1},\ _N\Sigma_{m=1},\ _{M(j)}\theta_j\times S_{m(j)} \quad (14)$$

where j denotes a divided region number with the pattern density being defined on the wafer, N the number of divided regions, m(j) a mesh number inside region j, and M (j) the number of meshes inside region j.

Figure 2:
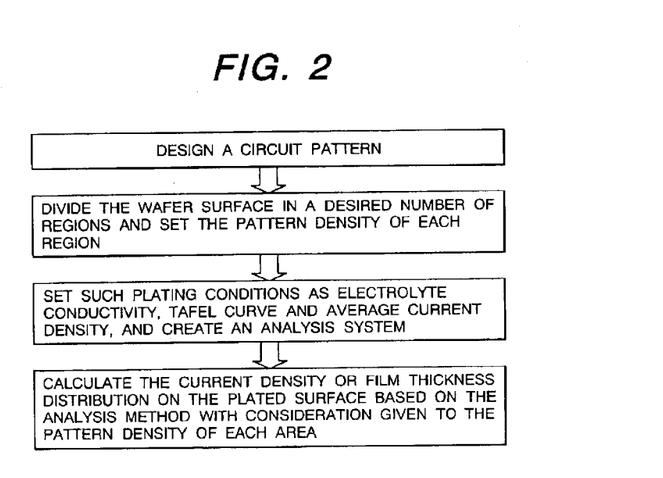
FIG. 2 is a flow chart representing the film thickness distribution analysis method using the approximation averaged by pattern density according to the present invention.

FIG. 2 is a flow chart representing the film thickness distribution analysis method when a line is formed on a printed circuit board by a pattern plating method, using the approximation averaged by pattern density according to the present invention.

First, a circuit pattern is designed. Then the wafer surface is divided into a desired number of regions to set the pattern density for each region. This is followed by the step of setting such plating conditions as electrolyte conductivity, Tafel curve and average current density whereby an analysis system is created. Using this analysis system, current density or film thickness distribution on the plated surface is calculated according to the analysis method with consideration given to the pattern density for each region of the system.

As described above, the method of analyzing film thickness distribution by electric field analysis (approximation method) is known to provide sufficiently good accuracy when electrolyte flow is a laminar flow uniform and parallel to the wafer surface and current density is smaller than diffusion limited current.

With reference to the embodiments given below, the following describes the effect of analysis using the approximation averaged by pattern density according to the present invention, based on the calculation method disclosed in the first embodiment.

In the first embodiment, the adequacy of approximation averaged by pattern density will be verified, taking an example of the two-dimensional analysis system characterized by greater width and a smaller number of lines that can be handled by strict calculation (calculation by prior art method).

Figure 3:
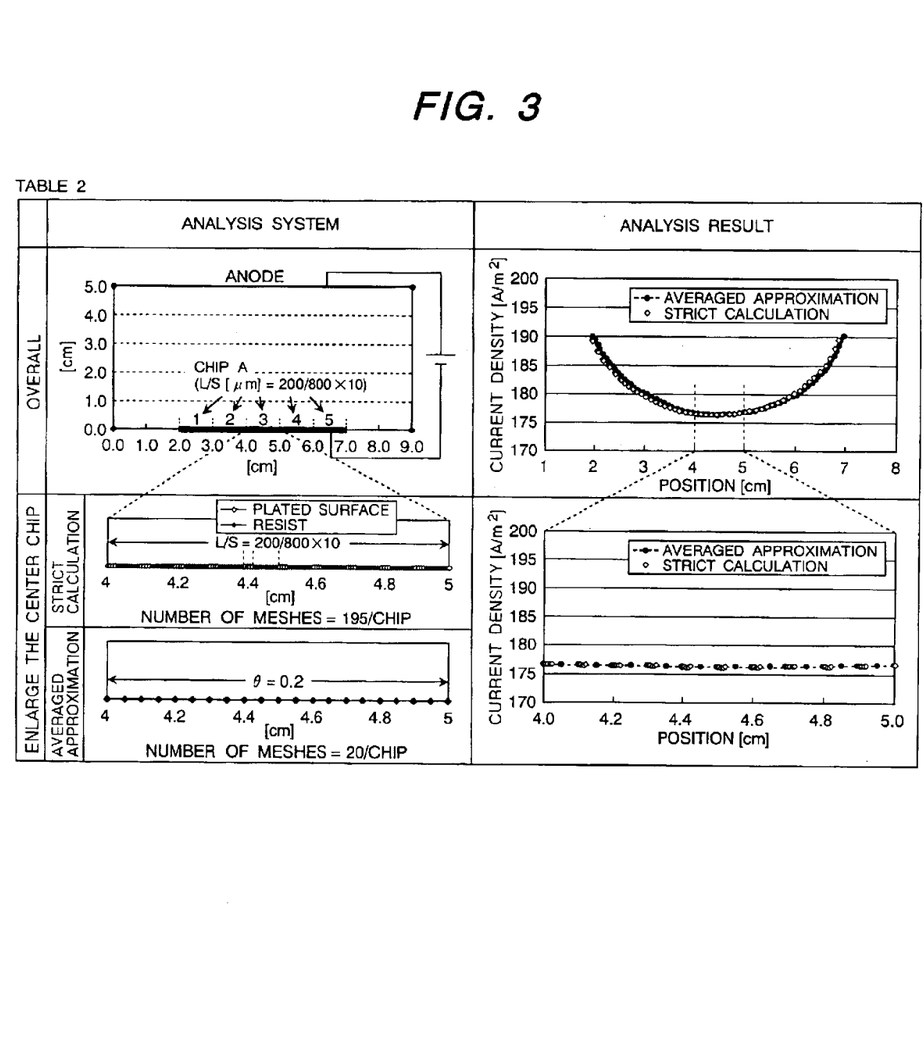
FIG. 3 is a diagram representing comparison between approximation averaged by pattern density according to the present invention and strict calculation according to the prior art method (Table 2)
Figure 4:
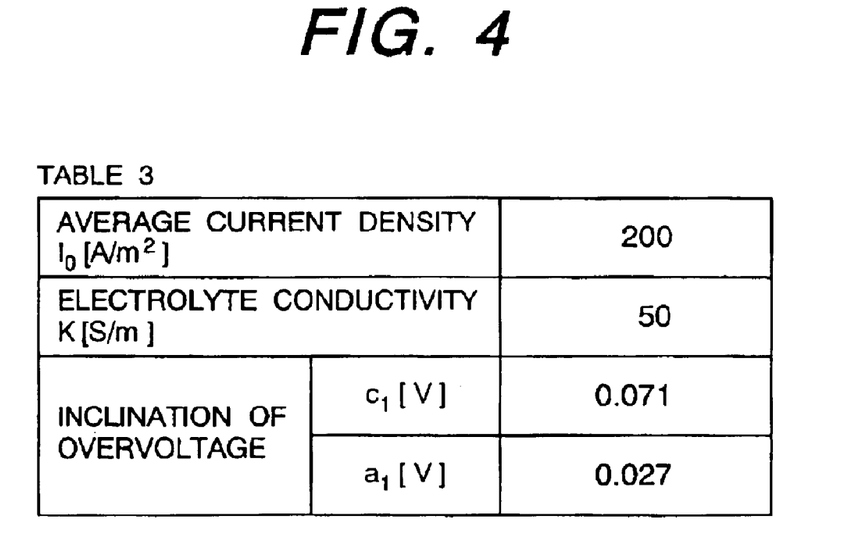
FIG. 4 is a chart representing the copper plating conditions used in the analysis of the present invention (Table 3)

FIG. 3 (Table 2) shows the analysis system and the result of analysis. Copper plating conditions that can be given in FIG. 4 (Table 3) are used as plating conditions. Va in equation (2) has been determined to ensure that the average current density on the plated surface will be the set value Io.

The cross section of the plating apparatus is shown in an overall view of the analysis system on the left top of FIG. 3 (Table 2). The cross section of the plating apparatus continues infinitely in the direction of depth because of two-dimensional analysis.

Five chips A are arranged on the printed circuit board (cathode) (indicated by chip numbers 1 through 5). Chip A comprises ten patterns with a line length (plated surface) of 200 μm and a space (resist) of 800 μm(L/S[μm]=200/800× 10).

In the strict calculation method (prior art calculation method), as shown in the analysis system (enlarged chip at the center) on the left bottom of FIG. 3 (Table 2), corresponding meshes are assigned to all lines and spaces. Equation (3) for boundary condition is applied to the line section, and equation (4) for boundary condition is applied to the space section. As a result, the number of meshes is 195 per chip.

In the approximation averaged by pattern density according to the present invention, by contrast, pattern on all surfaces of the chip θ=0.2 (=line width: 200 μm/(line width 200 μm+space width 800 μm), and equation (5) is applied to all surfaces of the chip. Thus, the number of meshes is 20 per chip, allowing a substantial reduction in the number of meshes.

The comparison of analysis results is given on the right of FIG. 3 (Table 2). It shows good agreement between strict calculation and the result of analysis according to approximation averaged by pattern density in the present invention.

In the second embodiment, for the analysis with much difference in circuit pattern densities, the adequacy of approximation averaged by pattern density will be verified, taking an example of the two-dimensional analysis system characterized by greater width and a smaller number of lines that can be handled by strict calculation (calculation by prior art method), as in the case of the first embodiment.

Figure 5:
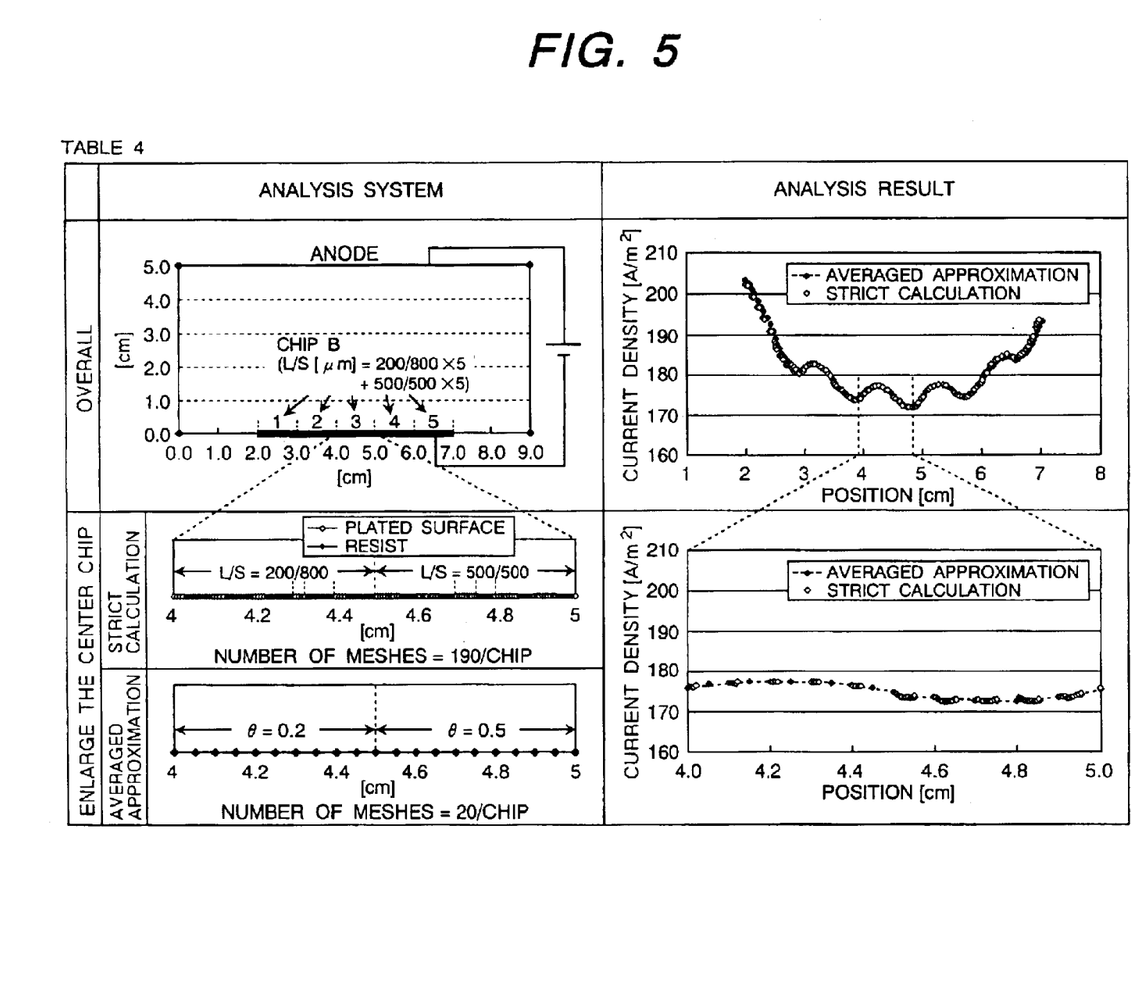
FIG. 5 is diagram representing comparison between approximation averaged by pattern density according to the present invention and strict calculation according to the prior art method (in the presence of much difference in pattern densities) (Table 4)

FIG. 5 (Table 4) shows the analysis system and the result of analysis. The plating apparatus and plating conditions are the same as those shown in the first example.

Five chips B are arranged on the printed circuit board (cathode). Chip B comprises five patterns with a line length (plated surface) of 200 μm and a space (resist) of 800 μm, and five patterns with a line length (plated surface) of 500 μm and a space (resist) of 500 μm (indicated as (L/S [μm]=200/800×5+500/500×5)).

In the strict calculation (according to prior art method), corresponding meshes are assigned to all lines and spaces. Equation (3) for boundary condition is applied to the line section, and equation (4) for boundary condition is applied to the space section, as in the case of the first embodiment.

In the approximation averaged by pattern density, θ=0.2 (=line width: 200 μm/(line width 200 μm+space width 800 μm) on the left side of the chip. On the right side of the chip, θ=0.5 (=line width: 500 μm/(line width 500 μm+space width 500 μm)). Equation (5) for boundary condition is applied to all surfaces of the chip.

Comparison of the analysis results is given on the right of FIG. 5 (Table 4). It shows good agreement between strict calculation and the result of analysis according to approximation averaged by pattern density in the present invention.

As described above, use of a different pattern density for each region in the chip (hence a different boundary conditions for each region) allows the number of meshes to be kept small, and has made it possible to get the result of analysis in agreement of strict calculation.

In the embodiment 3, another effective analysis method (zoom-in method) has been introduced for the analysis where there is much difference in densities as used in the second embodiment.

Figure 6:
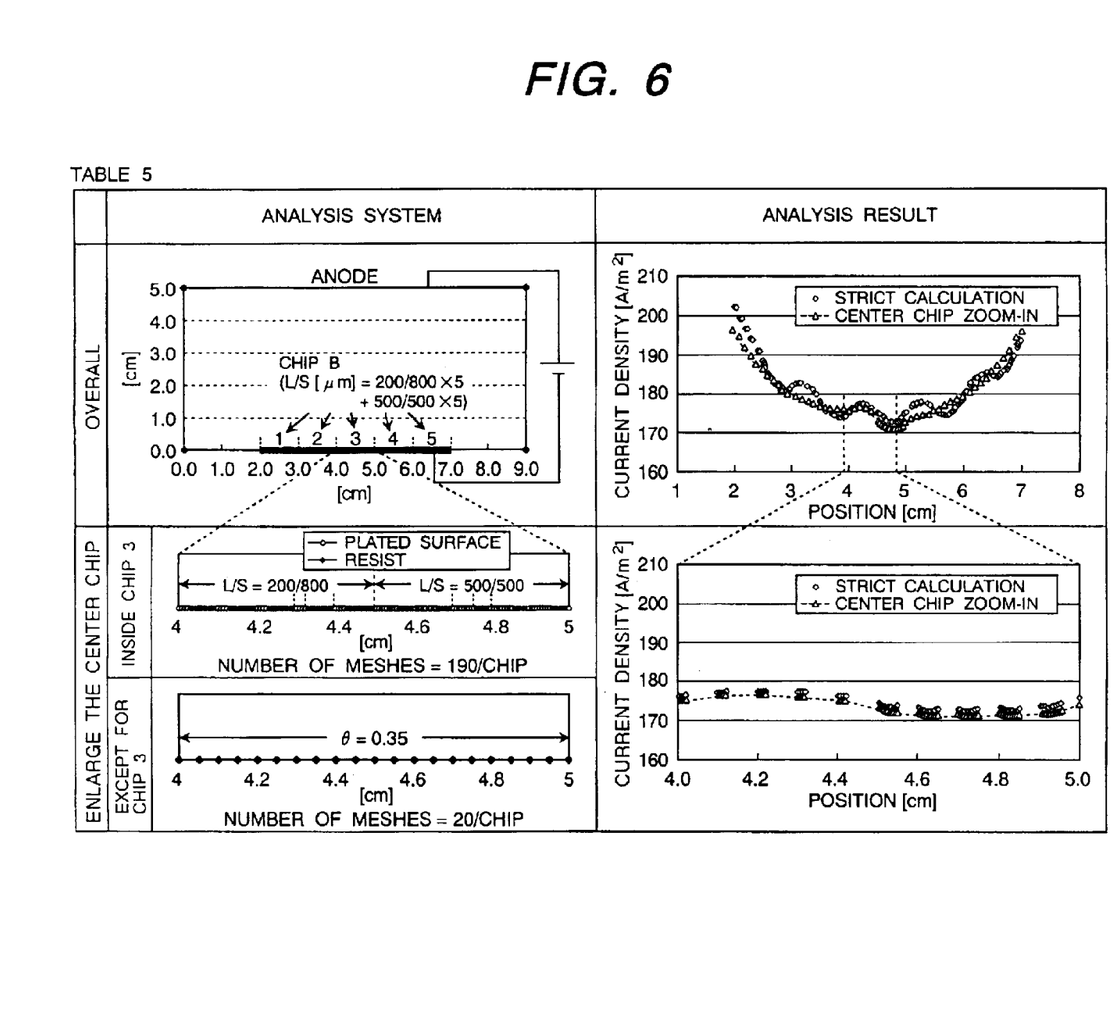
FIG. 6 is a diagram representing comparison between approximation averaged by pattern density plus zoom-in approximation and strict calculation by prior art method (Table 5)

The following describes the case where the current distribution of chip 3 at the center is analyses in details:

FIG. 6 (Table 5) shows the analysis system and the result of analysis.

As shown on the left bottom of FIG. 6 (Table 5), the mesh for strict calculation is assigned to the chip 3, and the same mesh as that of the approximation averaged by pattern density (pattern density θ=0.35 (={line width 200+500 μm/ (line width 200+500 μm+space width 800+500 μm}}/2) is assigned to other than chip 3.

Comparison of the analysis results is given on the right of FIG. 6 (Table 5). It shows good agreement between current density distribution and the analysis result of strict calculation. The number of meshes is increased only for chip 3, but there is a substantial reduction in terms of a total number of meshes.

Figure 7:
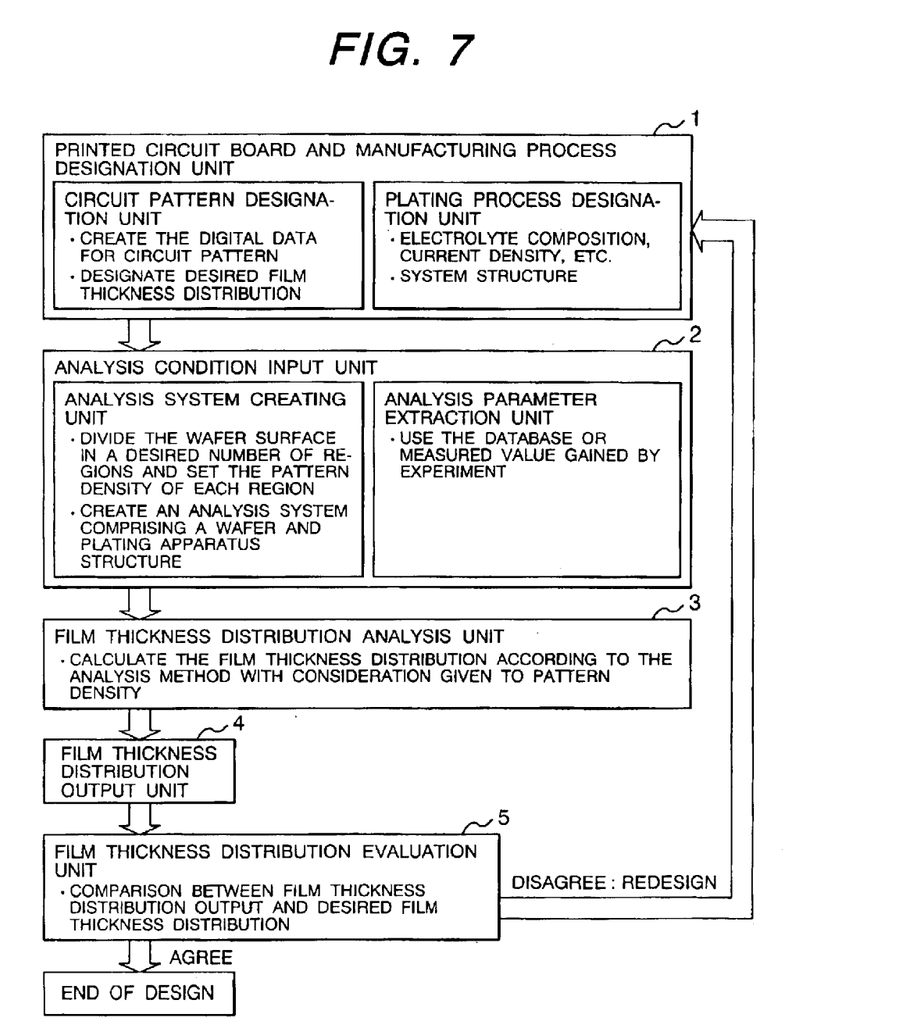
FIG. 7 is a diagram showing a design system of printed circuit boards and manufacturing processes based on the approximation averaged by pattern density according to the present invention.

FIG. 7 is a figure representing a third embodiment according to the present invention. It shows a design system of printed circuit boards and manufacturing processes, based on the approximation averaged by pattern density according to the present invention.

In FIG. 7, a designation unit 1 for designating printed circuit boards and manufacturing process comprises a circuit pattern designation unit and plating process designation unit. The design system of the present embodiment mainly provides process designing in the step of plating in the circuit pattern designing and manufacturing process. The circuit pattern designation unit is designed in such a way that the circuit pattern permits electric operations that the printed circuit board is required to perform. For the sake of subsequent film thickness distribution analysis treatment, it is preferred that the circuit pattern be created in the form of digital data. Further, as shown in FIG. 7, information on desired film thickness distribution is designated. This information on desired film thickness distribution includes the film thickness of the circuit pattern and permissible uneven range. The plating process designation unit designates the composition and current density of electrolyte, and the structure of the plating apparatus to be used, according to the material for film formation.

The analysis condition input unit 2 enters the information required to analyze the film thickness distribution based on approximation averaged by pattern density. The analysis condition input unit 2 comprises a analysis system creating unit and a analysis parameter extraction unit. The analysis system creating unit hypothetically divides the wafer surface into a desired number of regions, and sets the pattern density for each region. The analysis system creating unit creates an analysis system consists of the wafer surface divided into a desired number of regions and a plating apparatus.

The analysis parameter extraction unit extracts the parameters required for analysis (electrolyte conductivity and Tafel curves according to Equations (2) and (3)). Use is made of the database from the electrolyte composition or the measured value gained in experiment.

Using these entries, film thickness distribution is calculated according to analysis method based on approximation averaged by pattern density in the film thickness distribution analysis unit 3, and the result is output from the film thickness distribution output unit 4.

This is followed by the step of the film thickness distribution evaluation unit 5 comparing the result of film distribution output with desired film thickness distribution. Agreement between these two forms of film thickness distribution signifies achievement of the designing of the printed circuit boards and manufacturing process. It means termination of designing. If there is no agreement between these two forms of film thickness distribution, the system goes back to the printed circuit boards and manufacturing process designation unit to perform re-calculation under different conditions. The conditions may be changed by modification of a circuit pattern, introduction of a dummy pattern (a line that does not function as an actual circuit) and change of electrolyte composition and apparatus structure. This design system provides a guideline for modification as well when film thickness distribution is evaluated.

In the phase of designing printed circuit boards and manufacturing processes, it has been necessary to perform pattern designing, creation of a mask in conformity to the pattern, coating of a resist on the wafer, exposure thereof, plating, measurement of film thickness distribution.

By contrast, when the printed circuit boards and manufacturing processes are designed according to the present embodiment, there will be a substantial reduction in the step of experiment and tentative manufacture, hence shorter development time and less cost.

Figure 8:
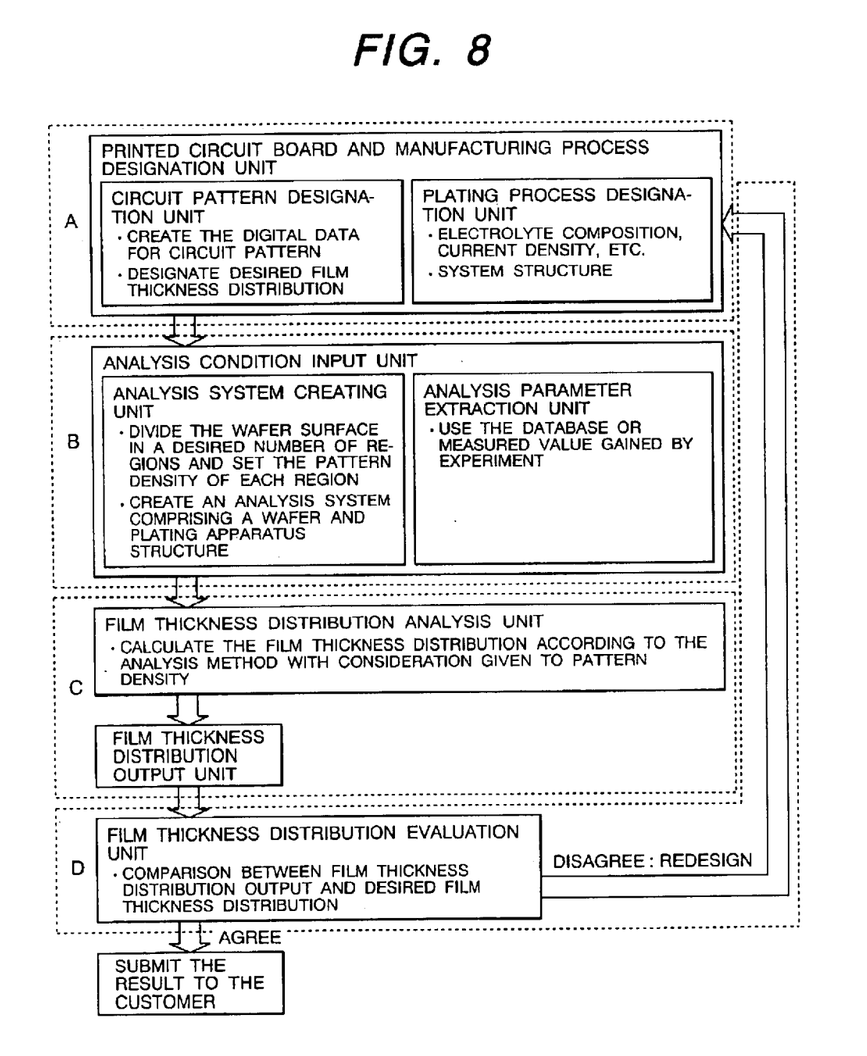
FIG. 8 is an explanatory diagram illustrating a design system of printed circuit boards and manufacturing processes based on the approximation averaged by pattern density according to the present invention.

FIG. 8 is a drawing representing a third embodiment of the present invention. It shows design support services for printed circuit boards and manufacturing processes. FIG. 8 illustrates the same design system of printed circuit boards and manufacturing processes as that of FIG. 7.

The form of services differs according to the customers in blocks A through D indicated by dotted lines and the range of responsibilities taken by a service provider.

In the first form of services, the service provider takes charge of all blocks A through D to design the printed circuit board that performs electric operations required by a customer. In the second form of services, block A is presented by the customer and the customer or service provider takes charge of the entire block B, or the work is shared between the customer or service provider. The service provider takes charge of block D according to customer requirements to design the printed circuit board and manufacturing process, and the result of designing is submitted to the customer. If the customer does not require block D, only the result of output meeting the conditions specified at block A by the customer is submitted to the customer.

These services allow the customer to achieve a substantial reduction in the step of experiment and tentative manufacture, hence shorter development time and less cost.

(Effects of the Invention)

As described above, the present invention permits a quick and efficient prediction of film thickness distribution in the pattern plating process of an actual product and improves efficiency in system structure designing and pattern designing. Further, in the design of printed circuit boards and manufacturing processes, the present invention ensures a substantial reduction in the step of experiment and tentative manufacture, hence shorter development time and less cost.

What is claimed is:

1. An analysis method of film thickness distribution for analyzing the distribution of film thickness of the deposited metal formed by electroplating method for selectively depositing metal on a printed circuit board, comprising the step of:

hypothetically dividing one or more printed circuit boards into one or more desired regions to get the area Sj of a desired region j and an area Aj of the plated surface inside said area j;

introducing the pattern density θj=Aj/Sj defined by the ratio Aj/Sj into the function used in the analysis method of film thickness distribution; and calculating the approximate average current density or film thickness distribution based on the function.

2. An analysis method of film thickness distribution according to claim 1, further comprising the step of:

setting the average current density of the entire analysis system=$[\Sigma_{j=1, N} \Sigma_{m=1, M(j)} \theta_j \times I_{m(j)} \times S_{m(j)}]/[\Sigma_{j=1, N} \Sigma_{m=1, M(j)} \theta_j \times S_{m(j)}]$ into a predetermined value Io (where $I_{m(j)}$ represents the current density in the mesh $m_{(j)}$ inside the region j on a divided printed circuit board, N represents the number of divided areas, and M(j) represents the number of meshes included in the area j).

3. An analysis method of film thickness distribution according to claim 1, characterized in that the area of one or more regions is smaller than the area of other regions.

4. An analysis method of film thickness distribution for analyzing the distribution of film thickness of the deposited metal formed by electroplating method for selectively depositing metal on a printed circuit board, comprising the step of:

hypothetically dividing one or more printed circuit boards into one or more desired regions to get the area Sj of a desired region j and an area Aj of the plated surface inside said area j;

introducing the pattern density θj=Aj/Sj defined by the ratio Aj/Sj in the equation representing the boundary conditions of said area j; and setting different boundary conditions corresponding to the pattern density θj for each region j.

5. An analysis method of film thickness distribution according to claim 4, further comprising the step of:

setting the average current density of the entire analysis system=$[\Sigma_{j=1,N}\Sigma_{m=1,M(j)}\theta_j \times I_{m(j)} \times S_{m(j)}]/[\Sigma_{j=1,N}\Sigma_{m=1,M(j)}\theta_j \times S_{m(j)}]$ into a predetermined value Io (where $I_{m(j)}$ represents the current density in the mesh $m_{(j)}$ inside the region j on a divided printed circuit board, N represents the number of divided areas, and M(j) represents the number of meshes included in the area j).

6. An analysis method of film thickness distribution according to claim 4, characterized in that the area of one or more regions is smaller than the area of other regions.

7. A design system of printed circuit boards and manufacturing processes, comprising:

a designation unit for designating a desired film thickness distribution to said printed circuit board and designating the plating process;

an analysis system creating unit for setting the pattern density $\theta j = Aj/Sj$ defined by the ratio $Aj/Sj$ (where Sj represents the area of a desired region j, and Aj represents an area of the plated surface inside said area j,) by hypothetically dividing said printed circuit board into desired regions;

a film thickness distribution analyzing unit for calculating film thickness distribution using said pattern density;

an output unit for outputting said film thickness distribution; and a film thickness distribution evaluation unit for comparing said film thickness distribution and said desired film thickness distribution.

8. A design system of printed circuit boards and manufacturing processes according to claim 7, characterized in that:

said film thickness distribution evaluation unit outputs the film thickness distribution corresponding to the circuit pattern and plating process conditions designated by a customer.

* * * * *